United States Patent
Kim et al.

(10) Patent No.: US 9,810,382 B2
(45) Date of Patent: Nov. 7, 2017

(54) LIGHT EMITTING MODULE HAVING LENS

(71) Applicant: Seoul Semiconductor Co., Ltd., Ansan-si (KR)

(72) Inventors: Eun Ju Kim, Ansan-si (KR); Kyung Hee Ye, Ansan-Si (KR); Young Eun Yang, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 559 days.

(21) Appl. No.: 14/379,423

(22) PCT Filed: Feb. 8, 2013

(86) PCT No.: PCT/KR2013/001041
§ 371 (c)(1),
(2) Date: Aug. 18, 2014

(87) PCT Pub. No.: WO2013/122358
PCT Pub. Date: Aug. 22, 2013

(65) Prior Publication Data
US 2015/0036353 A1 Feb. 5, 2015

(30) Foreign Application Priority Data
Feb. 16, 2012 (KR) .................. 10-2012-0015757

(51) Int. Cl.
*F21V 3/00* (2015.01)
*F21K 99/00* (2016.01)
(Continued)

(52) U.S. Cl.
CPC .................. *F21K 9/50* (2013.01); *F21K 9/60* (2016.08); *F21V 19/002* (2013.01); *H01L 33/58* (2013.01); *F21W 2131/103* (2013.01)

(58) Field of Classification Search
CPC ........................................................ F21K 9/60
See application file for complete search history.

(56) References Cited

U.S. PATENT DOCUMENTS 7,866,844 B2   1/2011   Yamaguchi
8,469,552 B2   6/2013   Moeller
(Continued)

FOREIGN PATENT DOCUMENTS

DE   102009021182   11/2010
EP   2098905   9/2009
(Continued)

OTHER PUBLICATIONS

International Search Report dated May 29, 2013 for PCT/KR2013/001041.
(Continued)

*Primary Examiner* — Evan Dzierzynski
(74) *Attorney, Agent, or Firm* — H.C. Park & Associates, PLC

(57) ABSTRACT

A light emitting module having a lens is disclosed. The light emitting module includes: a substrate having recesses; light emitting elements mounted within the recesses of the substrate; and a lens which is coupled with the substrate and diffuses the light emitted from the light emitting elements. The light emitting module can have a slim structure by mounting the light emitting elements within the recesses formed in the substrate.

16 Claims, 4 Drawing Sheets

(51) Int. Cl.
*H01L 33/58* (2010.01)
*F21V 19/00* (2006.01)
*F21K 9/60* (2016.01)
*F21W 131/103* (2006.01)

(56) References Cited

U.S. PATENT DOCUMENTS

| | | | |
|---|---|---|---|
| 9,530,947 B2 | 12/2016 | Kim et al. | |
| 2006/0152140 A1* | 7/2006 | Brandes | C09K 11/586 313/503 |
| 2010/0165637 A1 | 7/2010 | Premysler | |
| 2010/0284193 A1 | 11/2010 | Ford | |
| 2011/0085352 A1* | 4/2011 | Ito | H01L 33/50 362/617 |
| 2011/0116272 A1 | 5/2011 | Bak et al. | |
| 2012/0014115 A1* | 1/2012 | Park | G02B 27/0955 362/311.02 |
| 2012/0020093 A1* | 1/2012 | Yang | F21K 9/90 362/382 |

FOREIGN PATENT DOCUMENTS

| | | |
|---|---|---|
| JP | 2003-110146 | 4/2003 |
| JP | 2011-159970 | 8/2011 |
| KR | 10-2010-0009689 | 1/2010 |
| KR | 10-2010-0057384 | 5/2010 |
| KR | 10-2011-0109113 | 6/2011 |

OTHER PUBLICATIONS

Written Opinion dated May 29, 2013 for PCT/KR2013/001041.
Extended European Search Report dated Feb. 19, 2015, in European Patent Application 14181966.4.
Non-Final Office Action dated Jan. 15, 2016, in U.S. Appl. No. 14/469,100.
Non-Final Office Action dated Jan. 19, 2017, in U.S. Appl. No. 15/367,604.

* cited by examiner

[Fig. 1]
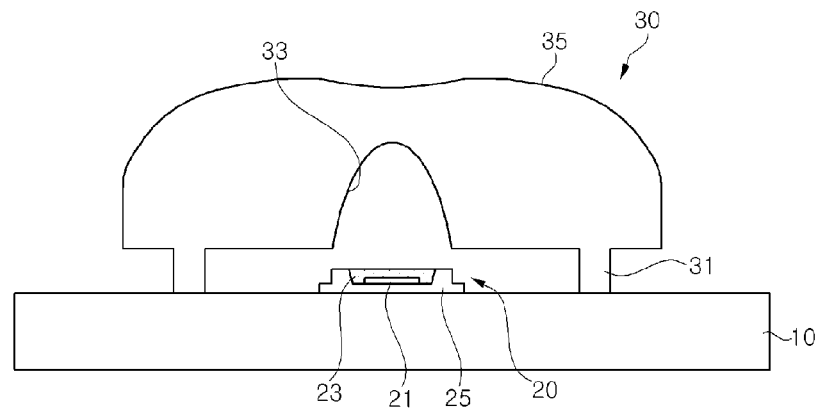
[Fig. 2]
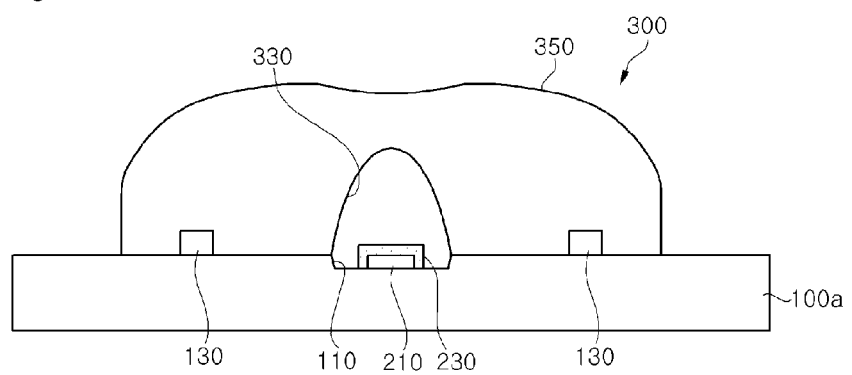
[Fig. 3]
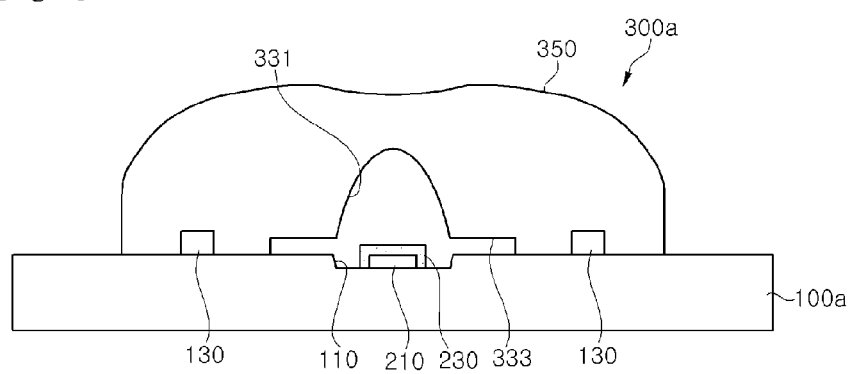

[Fig. 4]
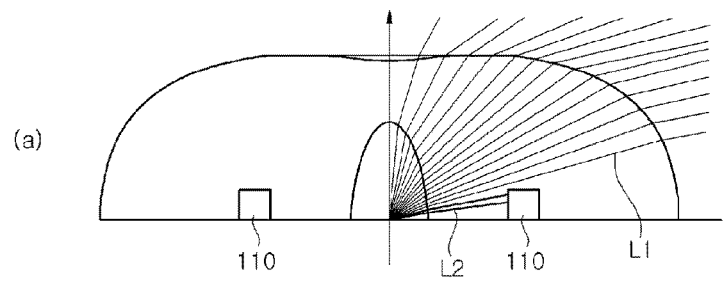
(a)
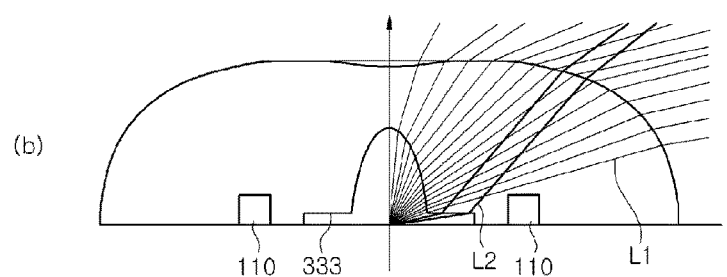
(b)
[Fig. 5]
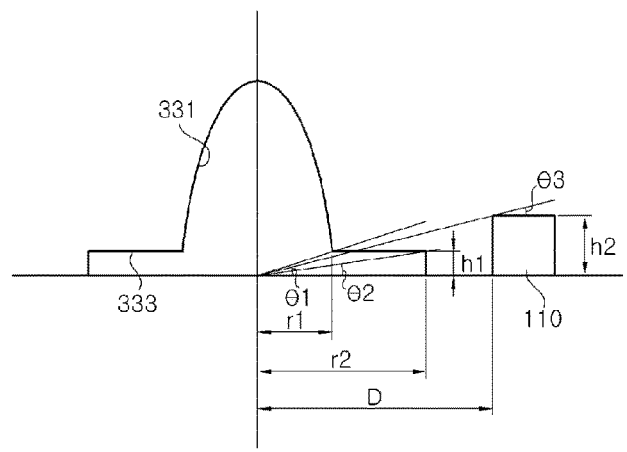
[Fig. 6]
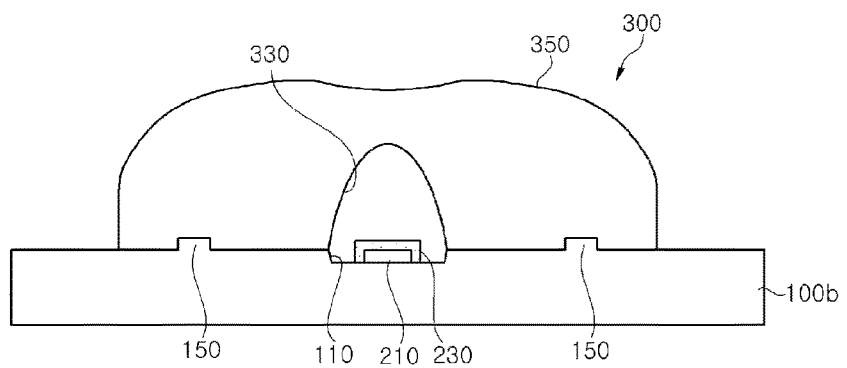

[Fig. 7]
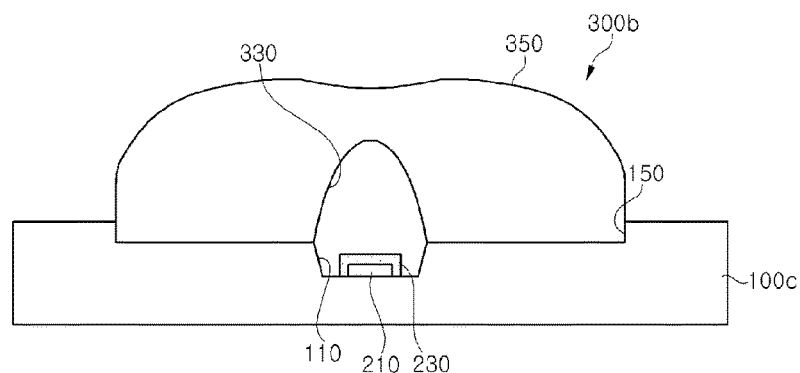
[Fig. 8]
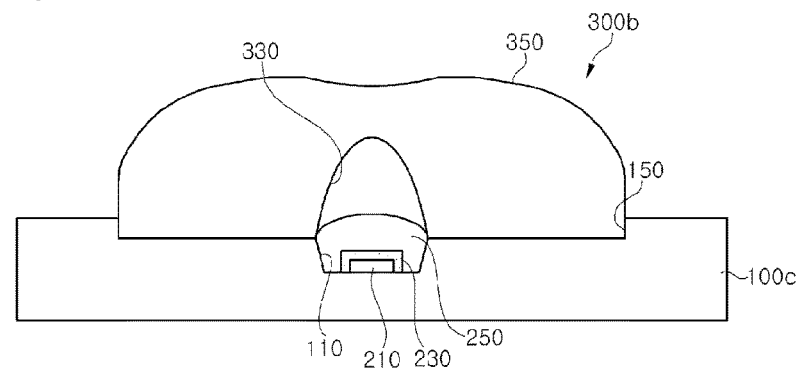
[Fig. 9]
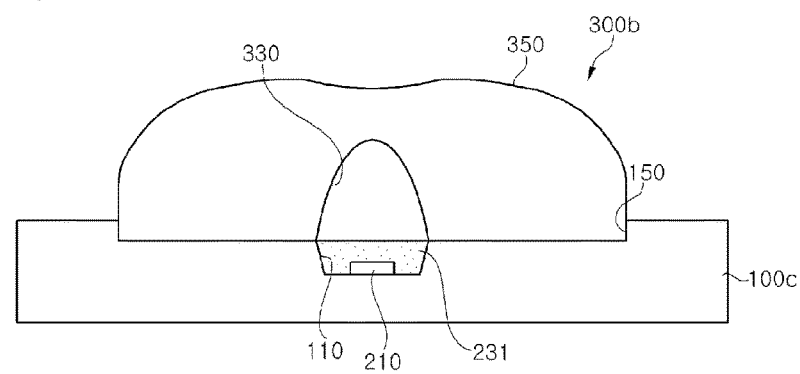
[Fig. 10]
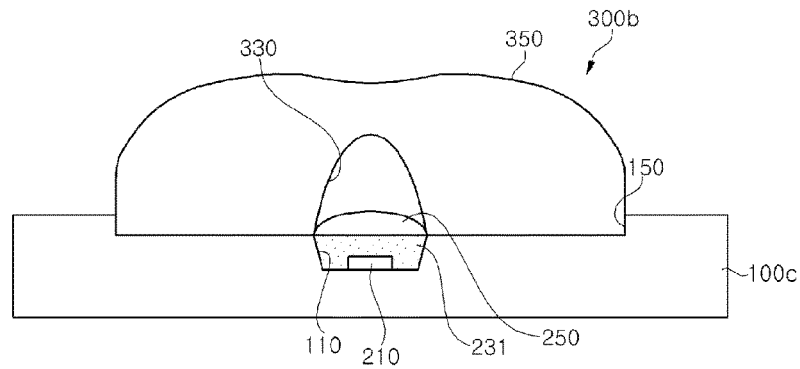

[Fig. 11]
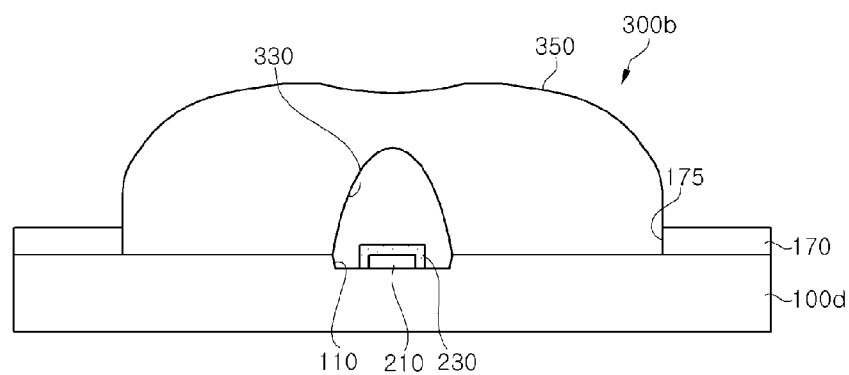
[Fig. 12]
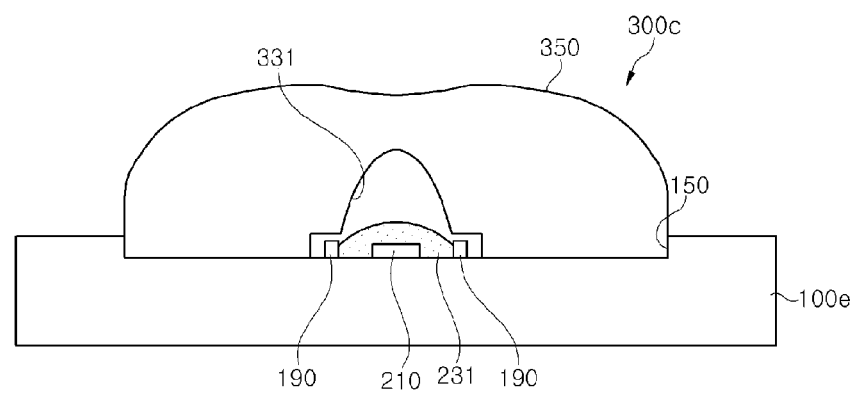
[Fig. 13]
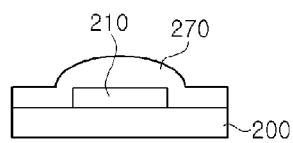

LIGHT EMITTING MODULE HAVING LENS

CROSS-REFERENCE TO RELATED APPLICATIONS

This application is the National Stage of International Application No. PCT/KR2013/001041, filed on Feb. 8, 2013, and claims priority from and the benefit of Korean Patent Application No. 10-2012-0015757, filed on Feb. 16, 2012, which are hereby incorporated by reference for all purposes as if fully set forth herein.

FIELD

The present invention relates to a light emitting module, and more particularly, to a light emitting module having a lens used for flat lighting or a backlight of a liquid crystal display.

DISCUSSION OF THE BACKGROUND

A light emitting module for backlighting a liquid crystal display or a light emitting module used for a flat lighting apparatus generally includes light emitting elements mounted on a substrate and a lens diffusing light emitted from the light emitting elements at a wide angle. A smaller number of light emitting elements may uniformly irradiate a wide area by uniformly dispersing light emitted from the light emitting elements using the lens.

FIG. 1 is a schematic cross-sectional view for describing a light emitting module according to the related art.

Referring to FIG. 1, the light emitting module includes a substrate 10, a light emitting element 20, and a lens 30. The substrate 10 is a printed circuit board on which a conductive pattern (not illustrated) is formed.

The light emitting element 20 includes a main body 25 having recesses, light emitting diode chips 21 mounted within the recesses, and a molding part 23 covering the light emitting diode chips 21 mounted within the recesses. The molding part 23 includes a phosphor which wavelength-converts light emitted from the light emitting diode chip 21. The light emitting element 20 is electrically connected to the conductive pattern of the substrate 10.

Meanwhile, the lens 30 has leg parts 31, in which the leg parts 31 are attached to the substrate 10 and thus are disposed on the light emitting element 20. The lens 30 has a light incident surface 33 on which the light emitted from the light emitting element 20 is incident and a light emitting surface 35 through which the incident light is emitted. The light incident surface 33 is provided at a lower portion of the lens 30 in a concave form.

The light emitting module according to the related art diffuses the light emitted from the light emitting element 20 through the lens 30 to be able to implement uniform light over a wide area. However, since the light emitting module has the light emitting element 20 mounted on the substrate 10 and the lens 30 mounted on the substrate 10 through the leg parts 31, there is a limitation in slimming the light emitting module. Further, since the light emitting module adopts the main body 25 having the recesses, a size of the light emitting element 20 is relatively large, and therefore a size of the lens 30 is relatively large.

Further, to implement a uniform surface light source, the light emitting diode chip 21 within the light emitting element 20, the light emitting element 20, and the lens 30 need to be precisely aligned, but the light emitting module according to the related art needs to precisely position all of the light emitting diode chip 21, the light emitting element 20, and the lens 30, and therefore there is a limitation in reducing an alignment tolerance.

SUMMARY

The present invention has been made in an effort to provide a light emitting module capable of reducing an overall height.

Further, the present invention has been made in an effort to provide a light emitting module capable of reducing an alignment tolerance.

According to exemplary embodiments of the present invention, there is provided a light emitting module, including: a substrate having recesses; light emitting elements mounted within the recesses of the substrate; and a lens coupled with the substrate and diffusing light emitted from the light emitting elements. The light emitting module may be more slimmed by mounting the light emitting elements within the recesses formed on the substrate.

Further, the light emitting element may be a light emitting diode chip or a chip type light emitting diode package. Here, the chip type light emitting diode package may be an ultrathin light emitting diode package which is formed by mounting the chip on the substrate provided with a lead circuit and forming a molding part sealing the chip.

A size of the lens may be more reduced by using the light emitting element having a size much smaller than the light emitting element adopting a main body having a cavity according to the related art. In particular, when the light emitting diode chip is directly mounted on the substrate, since there is no need to consider an alignment tolerance of the package, the alignment tolerance may be reduced.

The light emitting element may further include a phosphor layer conformally coated on, in particular, the light emitting diode chip. Unlike this, the molding part may cover the light emitting diode chip and the phosphor may be contained within the molding part. According to some exemplary embodiments of the present invention, the conformal coated phosphor layer or the molding part containing the phosphor may be covered with a transparent resin.

The lens may be coupled with the substrate without adopting the existing leg parts. Therefore, a lower surface of the lens may be closed to an upper surface of the substrate to more slim the light emitting module.

For example, the substrate may have a protrusion mounted on an upper surface thereof, the lens may have a receiving groove in which the protrusion is received, and the lens may be coupled with the substrate by making the receiving groove receive the protrusion. Alternatively, instead of the protrusion, the dam part may be formed on the substrate and the lens may be coupled with the substrate by making the receiving groove receive the dam part. The dam part may be formed of a silicon resin or an optical sheet.

According to another exemplary embodiment of the present invention, the light emitting module may further include an optical sheet attached to the substrate and having an opening through which the light emitting elements are exposed. The lens may be fitted in the opening of the optical sheet to be coupled with the substrate.

According to another exemplary embodiment of the present invention, the recess may be formed to receive the lens and the lens may be fitted in an inner wall of the recess to be coupled with the substrate.

The recess may include a first recess and a second recess enclosing the first recess, the light emitting element may be mounted within the first recess, and the lens may be fitted in the second recess to be coupled with the substrate.

Meanwhile, the lens may have a light incident surface on which light emitted from the light emitting element is incident and a light emitting surface through which the incident light is emitted. The light incident surface may be an inner surface of a concave part positioned on a lower surface of the lens. Further, the concave part may include a first concave part and a second concave part positioned at an inlet side of the first concave part to enclose the first concave part. Further, a height of the second concave part may be smaller than that of the dam part, the protrusion, or the second recess. The second concave part may reduce a loss of light progressed through the lens.

According to the exemplary embodiments of the present invention, it is possible to slim the light emitting module and reduce the alignment tolerance of the light emitting module by directly mounting the light emitting diode chip on the substrate.

BRIEF DESCRIPTION OF THE DRAWINGS

FIG. 1 is a cross-sectional view for describing a light emitting module according to the related art.

FIG. 2 is a cross-sectional view for describing a light emitting module according to an exemplary embodiment of the present invention.

FIG. 3 is a cross-sectional view for describing a light emitting module according to another exemplary embodiment of the present invention.

FIGS. 4A and 4B are cross-sectional views illustrating a light path of the light emitting module of FIGS. 2 and 3.

FIG. 5 is a cross-sectional view for describing a shape of a lens adopted in the light emitting module of FIG. 3.

FIGS. 6 to 12 are cross-sectional views for describing various light emitting modules according to the exemplary embodiments of the present invention.

FIG. 13 is a cross-sectional view for describing a chip type light emitting diode package.

DETAILED DESCRIPTION OF THE ILLUSTRATED EMBODIMENTS

Hereinafter, exemplary embodiments of the present invention will be described in detail with reference to the accompanying drawings. The exemplary embodiments of the present invention to be introduced below are provided by way of example so that the idea of the present invention can be sufficiently transferred to those skilled in the art to which the present invention pertains. Therefore, the present invention is not limited to the exemplary embodiments set forth herein but may be modified in many different forms. In the accompanying drawings, widths, lengths, thicknesses, or the like, of components may be exaggerated for convenience. Like reference numerals denote like elements throughout the specification.

FIG. 2 is a cross-sectional view for describing a light emitting module according to an exemplary embodiment of the present invention.

Referring to FIG. 2, the light emitting module includes a substrate 100a, a dam part 130, a light emitting diode chip 210, a conformal coated phosphor layer 230, and a lens 300. The substrate 100a is a substrate on which a printed circuit (not illustrated) is formed and has a recess 110.

The dam part 130 is formed around the recess 110. The dam part 130 may be formed by attaching an optical sheet to the substrate 100a in a ring shape and may also be formed of a silicon resin.

The light emitting diode chip 210 is mounted within the recess 110. The light emitting diode chip 210 is directly connected to the printed circuit on the substrate 100a within the recess 110. The light emitting diode chip 210 is a semiconductor chip formed of gallium nitride-based compound semiconductor and may emit ultraviolet rays or blue-based light.

Meanwhile, the light emitting diode chip 210 may be covered with a wavelength conversion material. As illustrated, the conformal coated phosphor layer 230 may be formed on the light emitting diode chip 210 and may wavelength-convert light emitted from the light emitting diode chip 210. Light having various colors may be implemented using the light emitted from the light emitting diode chip 210 and the wavelength conversion material, and in particular, mixed light such as white light may be implemented.

According to the exemplary embodiment of the present invention, an upper surface of the light emitting diode chip 210 may be positioned within the recess 110, but may also be positioned on the same surface as the upper surface of the substrate 100a. Meanwhile, according to the exemplary embodiment of the present invention, the conformal coated phosphor layer 230 is previously formed on the light emitting diode chip 210 and thus is mounted on the substrate 100a along with the light emitting diode chip 210. Unlike this, the light emitting diode chip 210 is mounted within the recess 110 of the substrate 100a and a molding part containing a phosphor to cover the light emitting diode chip 210 may also be formed within the recess 110.

Meanwhile, the lens 300 has a light incident surface 330 on which light emitted from the light emitting diode chip 210 is incident and a light emitting surface 350 through which light is emitted from the lens 300 to the outside. The light incident surface 330 may be an inner surface of a concave part having a ring shape as illustrated. The lens 300 diffuses light incident from the light emitting diode chip 210 using a refraction of light at the light incident surface 330 and a refraction of light at the light emitting surface 350.

The lens 300 also has a receiving groove in which the dam part 130 is received and may receive the dam part 130 to couple the lens 300 with the substrate 100a. Since the lens 300 may be coupled with the substrate 100a using the dam part 130 and the receiving groove of the lens 300, the existing leg parts 31 (FIG. 1) may be removed.

FIG. 3 is a cross-sectional view for describing a light emitting module according to another exemplary embodiment of the present invention.

Referring to FIG. 3, the light emitting module according to the exemplary embodiment of the present invention is substantially similar to the light emitting module described with reference to FIG. 2 but differs from the light emitting module of FIG. 2 in a shape of a concave part of a lens 300a.

That is, a light incident surface of the lens 300a according to the exemplary embodiment of the present invention includes an inner surface 331 of a first concave part having a ring shape and an inner surface 333 of a second concave part enclosing the first concave part. The second concave part is formed at an inlet side of the first concave part and has a relatively wider width than that of the first concave part.

The inner surface 333 of the second concave part changes a progress path of light incident from the light emitting diode chip 210 to an upper side to prevent light from being lost due to the light absorbed into the dam part 130.

FIGS. 4A and 4B each are cross-sectional views illustrating a light path of the light emitting module of FIGS. 2 and 3 and illustrate that the second concave part of FIG. 3 changes the light path to prevent light from being loss.

Referring to FIG. 4A, the light emitted from the light emitting diode chip 210 is refracted in the inner surface of the concave part and then is progressed into the lens 300 and emitted to the outside through the light emitting surface 350. L1 of FIG. 4A represents a path of light emitted to the outside through the light emitting surface 350. Meanwhile, some of light L2 is progressed into the receiving groove of the lens 300, that is, into the dam part 110 to be absorbed into the dam part 110, and as a result may be lost.

Referring to FIG. 4B, the second concave part is formed to change a path of the light L2 in the inner surface 333 of the second concave part, thereby preventing the light L2 from being absorbed into the dam part 110. Therefore, the loss of light may be more prevented than the lens 300 of FIG. 4A.

FIG. 5 is a cross-sectional view for describing in detail a shape of the lens adopted in the light emitting module of FIG. 3.

Referring to FIG. 5, ½ of a width of an inlet of the first concave part is represented by r1, ½ of a width of the second concave part is represented by r2, a distance from a central axis of the lens to the dam part 110 is represented by D, a height of the second concave part is represented by h1, and a height of the dam part 110 is represented by h2. Therefore, $\Theta1$, $\Theta2$, and $\Theta3$ are defined as follows. $\tan(\Theta1)=h1/r1$, $\tan(\Theta2)=h1/r2$, $\tan(\Theta3)=h2/D$.

Here, the height h1 of the second concave part is preferably smaller than the height h2 of the dam part and when the second concave part is higher than the dam part 110, a quantity of the light L2 progressed along the light path changed through the inner surface 333 of the second concave part is increased, such that it is difficult to obtain uniform light over a wide area.

Meanwhile, when $\Theta1$ is smaller than $\Theta3$, some of the light progressed through the inner surface 331 of the first concave part is progressed into the dam part 110 and thus may be lost, such that $\Theta1$ is preferably larger than $\Theta3$. Further, when $\Theta2$ is larger than $\Theta3$, the light progressed into the dam part 110 through an inner wall of the second concave part is increased and thus the light lost by the dam part 110 may be increased, such that $\Theta2$ is preferably smaller than $\Theta3$.

The exemplary embodiment of the present invention describes that to prevent light from being lost due to the dam part 110, the inner surface 333 of the second concave part is used, but it will be understood that the second concave part is positioned on the light path to prevent light from being lost due to the dam part as well as various obstacles absorbing light.

FIG. 6 is a cross-sectional view for describing a light emitting module according to another exemplary embodiment of the present invention.

Referring to FIG. 6, the light emitting module according to the exemplary embodiment of the present invention is substantially similar to the light emitting module described with reference to FIG. 2 but differs from the light emitting module of FIG. 2 in that a substrate 100b has a protrusion 150. That is, the light emitting module of FIG. 2 forms the dam part 110 to couple the lens 300 with the substrate 100a, but in the light emitting module according to another exemplary embodiment of the present invention, the protrusion 150 is provided on the substrate 100b to couple the lens 300.

According to another exemplary embodiment of the present invention, instead of the dam part 110, the protrusion 150 is formed on the substrate 100b and thus there is no need to form the dam part 110.

Meanwhile, as described with reference to FIG. 3, to prevent the loss of light due to the protrusion 150, the inlet of the first concave part may be provided with the second concave part.

FIG. 7 is a cross-sectional view for describing a light emitting module according to another exemplary embodiment of the present invention.

Referring to FIG. 7, the light emitting module according to the exemplary embodiment of the present invention is substantially similar to the light emitting module described with reference to FIG. 2, but differs from the light emitting module of FIG. 2 in that a substrate 100c is provided with a recess (second recess 150) enclosing the recess (first recess 110) and a lens 300b is fitted in the second recess 150.

That is, the lens 300b is coupled using the second recess 150 instead of using the dam part 110 of FIG. 2, and therefore there is no need to form the dam part 110 and form the receiving groove in the lens 300b.

Further, an outer side of the lens 300b is fitted in the inner wall of the second recess 150 to prevent light from being lost in the lens 300b. Further, to prevent light from being lost due to the inner wall of the second recess 150, the second concave part as described with reference to FIG. 3 may also be formed.

FIG. 8 is a cross-sectional view for describing a light emitting module according to another exemplary embodiment of the present invention.

Referring to FIG. 8, the light emitting module according to the exemplary embodiment of the present invention is substantially similar to the light emitting module described with reference to FIG. 7 but differs from the light emitting module of FIG. 7 in that a transparent resin 250 covering the light emitting diode chip 210 and the phosphor layer 230 is formed within the first recess 110.

The transparent resin 250 may be formed to cover the light emitting diode chip 210 with silicon, epoxy, or the like after the light emitting diode chip 210 is mounted within the first recess 110.

FIG. 9 is a cross-sectional view for describing a light emitting module according to another exemplary embodiment of the present invention.

Referring to FIG. 9, the light emitting module according to the exemplary embodiment of the present invention is substantially similar to the light emitting module described with reference to FIG. 7 but differs from the light emitting module of FIG. 7 in that instead of the conformal coated phosphor layer 230, a molding part 231 containing a phosphor is formed.

The molding part 231 may be formed within the first recess 110 to cover the light emitting diode chip 210 after the light emitting diode chip 210 is mounted within the first recess 110.

FIG. 9 illustrates that the molding part 231 fills the first recess 110 to form a flat surface but a shape of an upper surface of the molding part 231 is not limited to the flat surface and therefore may also be formed as a concave surface or a convex surface.

FIG. 10 is a cross-sectional view for describing a light emitting module according to another exemplary embodiment of the present invention.

Referring to FIG. 10, the light emitting module according to the exemplary embodiment of the present invention is substantially similar to the light emitting module described with reference to FIG. 9 but differs from the light emitting module of FIG. 9 in that the transparent resin 250 covering the light emitting diode chip 210 and the molding part 231 is formed. The transparent resin 250 may be formed to cover the molding part 231 with silicon, epoxy, or the like after the light emitting diode chip 210 is mounted within the first recess 110 and the molding part 231 is formed.

FIG. 11 is a cross-sectional view for describing a light emitting module according to another exemplary embodiment of the present invention.

Referring to FIG. 11, the light emitting module according to the exemplary embodiment of the present invention is substantially similar to the light emitting module described with reference to FIG. 7, but differs from the light emitting module of FIG. 7 in that an optical sheet 170 having an opening 175 with which the lens 300b may be coupled to a substrate 100d and the lens 300b is coupled with the opening 175.

That is, instead of the second recess 150 of FIG. 7, the opening 175 of the optical sheet 170 is used. Therefore, there is no need to form the second recess 150 on the substrate 100d.

FIG. 12 is a cross-sectional view for describing a light emitting module according to another exemplary embodiment of the present invention.

Referring to FIG. 12, the light emitting module according to the exemplary embodiment of the present invention is substantially similar to the light emitting module described with reference to FIG. 7, but differs from the light emitting module of FIG. 7 in that a substrate 100e does not have the first recess 110 and the second concave part is formed so that a lens 300c receives the light emitting diode chip 210 and the molding part 231.

That is, in the light emitting module according to the exemplary embodiment of the present invention, the recess 150 with which the lens 300c may be coupled is formed and the light emitting diode chip 210 is mounted within the recess 150. Further, a dam part 190 is formed around the light emitting diode chip 210 and the molding part 231 containing the phosphor is formed inside a region enclosed by the dam part 190 to seal the light emitting diode chip 210.

Meanwhile, the lens 300c is fitted in the inner wall of the recess 150 to be coupled with a substrate 100e. The lens 300c is also provided with the first concave part and the second concave part to receive the dam part 190 and the molding part. Therefore, the light emitting diode chip 210 is positioned inside the concave part of the lens 300c.

According to the foregoing exemplary embodiments, the light emitting diode chip 210 is mounted on the substrate and the lens is coupled with the substrate without using the leg parts, thereby providing the light emitting module having the slimmer structure than the light emitting module according to the related art.

The foregoing exemplary embodiments describe that the light emitting diode chip 210 is directly mounted on the substrates 100a to 100e, but the light emitting diode chip 210 may also be mounted using the chip type light emitting diode package as illustrated in FIG. 13.

The chip type light emitting diode package has a simple structure by mounting the chip 210 on the substrate 200 provided with a lead circuit (not illustrated) and covering the chip 210 with the molding part 270 to be more miniaturized than the light emitting diode package having a cavity.

Therefore, even though instead of directly mounting the light emitting diode chip 210 on the substrates 100a to 100e of the light emitting module, the chip type light emitting diode package is mounted on the substrates 100a to 100e, the light emitting module may have a slimmer structure than the light emitting module according to the related art.

The invention claimed is:

1. A light-emitting module, comprising:
a substrate comprising a first recess and a second recess encompassing the first recess which is recessed within the second recess;
a light-emitting element disposed in the first recess; and
a lens disposed on the substrate in the second recess and covering the light-emitting element, the lens configured to diffuse light emitted from the light-emitting element.

2. The light-emitting module of claim 1, wherein the light-emitting element comprises a light-emitting diode chip or a chip-type light-emitting diode package.

3. The light-emitting module of claim 2, wherein the light-emitting element further comprises a phosphor layer conformally coated on the light-emitting diode chip.

4. The light-emitting module of claim 2, wherein a side surface of the lens is fitted in the recess by contacting an inner wall of the second recess.

5. The light-emitting module of claim 1, further comprising a wavelength conversion material covering the light-emitting element.

6. The light-emitting module of claim 5, further comprising a transparent resin disposed between the wavelength conversion material and the lens, the transparent resin covering the wavelength conversion material.

7. The light-emitting module of claim 1, wherein the lens comprises:
a light incident surface on which light emitted from the light emitting element is incident; and
a light emitting surface through which the incident light is emitted.

8. The light-emitting module of claim 7, wherein the light incident surface is an inner surface of a concave part of a lower surface of the lens.

9. The light-emitting module of claim 8, wherein:
the concave part comprises a first portion and a second portion disposed at an inlet side of the first portion; and
the second portion encompasses the first portion.

10. The light-emitting module of claim 7, wherein:
the light incident surface is an inner surface of a concave part of a lower surface of the lens;
the concave part comprises a first portion and a second portion disposed at an inlet side of the first portion; and
the second portion encompasses the first portion.

11. The light-emitting module of claim 10, wherein the height of the second portion is less than the height of the second recess.

12. The light-emitting module of claim 10, wherein:
half of the width of the inlet of the first portion is represented by r1;
half of the width of the second portion is represented by r2;
a distance from a central axis of the lens to the second recess is represented by D;
a height of the second portion is represented by h1;
a height of the second recess is represented by h2;
$\tan(\Theta 1) = h1/r1$, $\tan(\Theta 2) = h1/r2$, $\tan(\Theta 3) = h2/D$; and
$\Theta 1 > \Theta 3$ and $\Theta 2 < \Theta 3$.

13. A light-emitting module, comprising:
a substrate comprising a recess;
a light-emitting element disposed in the recess; and
a lens disposed directly on the substrate and covering the light-emitting element, the lens configured to diffuse light emitted from the light-emitting element,
wherein:
the substrate comprises a protrusion extending from an upper surface thereof;
the lens comprises a groove, the protrusion being disposed in the groove and directly connecting the lens and the substrate.

14. A light-emitting module, comprising:
a substrate comprising a recess;
a dam part disposed directly on the substrate;
a light-emitting chip disposed in the recess;

a lens disposed on the substrate and directly on the dam part and covering the light-emitting element, the lens configured to diffuse light emitted from the light-emitting element, wherein the lens comprises a groove, the dam part being disposed in the groove and connecting the lens and the dam part.

15. The light-emitting module of claim 14, wherein the dam part comprises a silicon resin or an optical sheet.

16. A light-emitting module, comprising:

a substrate comprising a recess;

a light-emitting element disposed in the recess; and a lens disposed on the substrate and covering the light-emitting element, the lens configured to diffuse light emitted from the light-emitting element; and an optical sheet disposed on the substrate and comprising an opening exposing the light-emitting element, wherein the lens is disposed in the opening and contacts the substrate in the opening.

* * * * *